(12) United States Patent
Shih et al.

(10) Patent No.: US 7,158,386 B2
(45) Date of Patent: Jan. 2, 2007

(54) BALANCED RADIO FREQUENCY POWER AMPLIFIER WITH TEMPERATURE COMPENSATION

(75) Inventors: Chuming David Shih, Chandler, AZ (US); Ahmad Khanifar, Laguna Hills, CA (US); Nikolai Maslennikov, Huntington Beach, CA (US); Richard Sweeney, Rancho Santa Margarita, CA (US)

(73) Assignees: Powerwave Technologies, Inc., Santa Ana, CA (US); Freescale Semiconductor, Inc., Austin, TX (US)

( * ) Notice: Subject to any disclaimer, the term of this patent is extended or adjusted under 35 U.S.C. 154(b) by 181 days.

(21) Appl. No.: 10/431,688

(22) Filed: May 8, 2003

(65) Prior Publication Data
US 2004/0222848 A1 Nov. 11, 2004

(51) Int. Cl.
H05K 7/02 (2006.01)
(52) U.S. Cl. ...................... 361/760; 330/295
(58) Field of Classification Search ............. 330/295, 330/307, 66; 333/128, 136; 361/760
See application file for complete search history.

(56) References Cited

U.S. PATENT DOCUMENTS

| 6,081,160 | A | 6/2000 | Custer et al. |
| 6,794,953 | B1* | 9/2004 | Brandt ..................... 333/116 |
| 6,828,862 | B1 | 12/2004 | Barak |
| 6,847,258 | B1* | 1/2005 | Ishida et al. ............. 330/124 R |
| 6,922,106 | B1* | 7/2005 | Lautzenhiser et al. ...... 330/295 |
| 2003/0227330 | A1 | 12/2003 | Khanifar et al. |

* cited by examiner

*Primary Examiner*—Henry Choe
(74) *Attorney, Agent, or Firm*—Myers Dawes Andras & Sherman, LLP.

(57) ABSTRACT

A radio frequency power amplifier has first and second amplifier transistors. The first and second amplifier transistors have a common element thereof electrically interconnected with a common bus. A forked conductor having two legs thereof electrically connected to the common bus, each leg having a distal end proximate one of the first and second amplifier transistors. The common bus and the forked conductor are generally symmetric about an axis about which the first and second amplifier transistors are symmetrically disposed.

50 Claims, 6 Drawing Sheets

INPUT SIDE                    OUTPUT SIDE

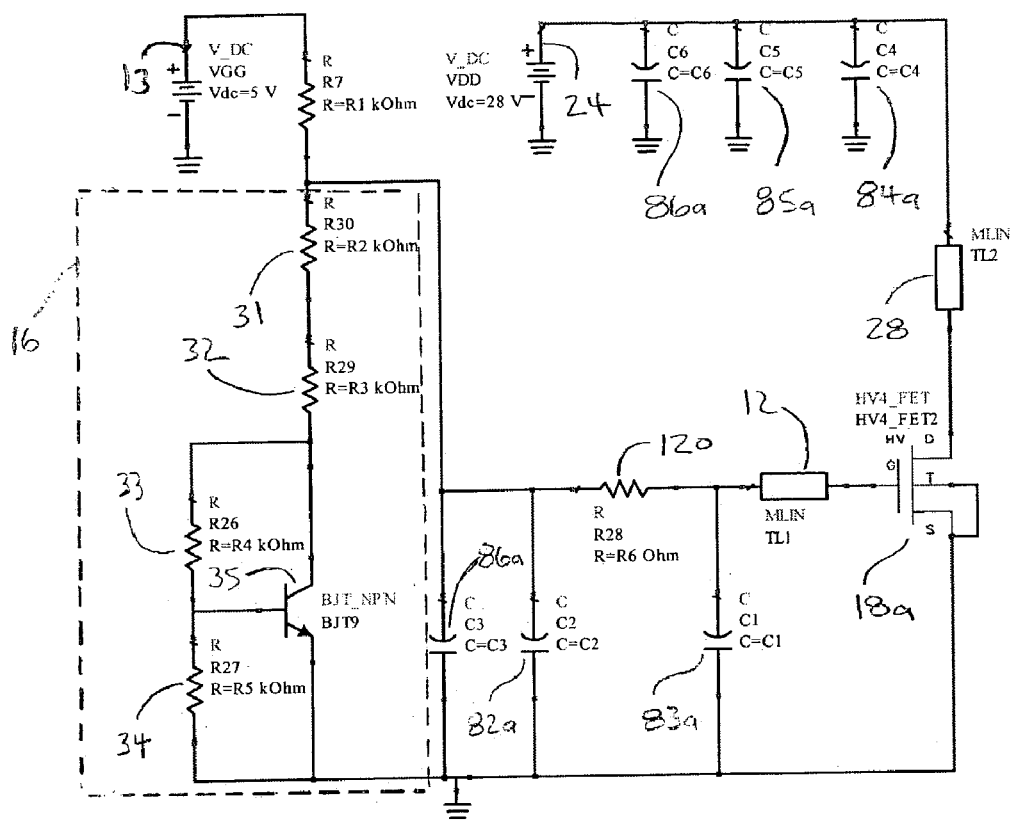
FIG. 6
FIG. 7
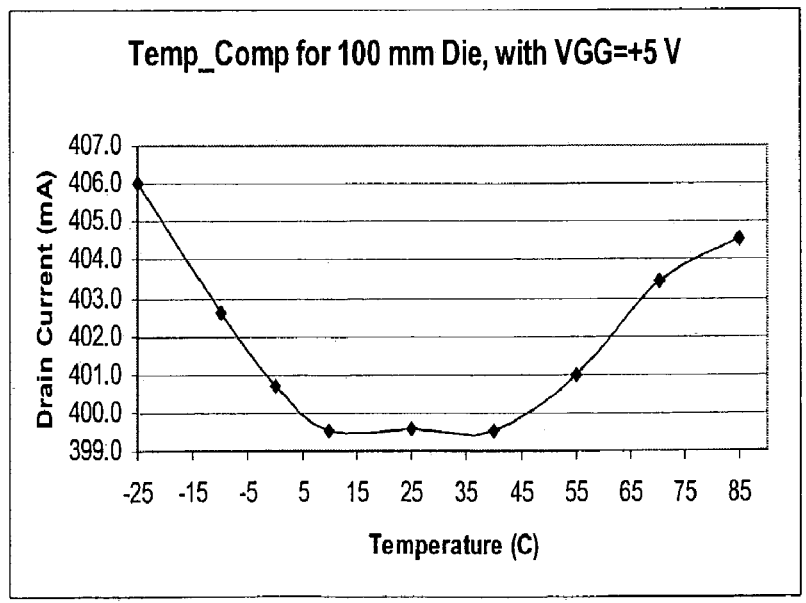

BALANCED RADIO FREQUENCY POWER AMPLIFIER WITH TEMPERATURE COMPENSATION

FIELD OF THE INVENTION

The present invention relates generally to radio frequency power amplifiers such as those commonly used in cellular telephone communications systems. The present invention relates more particularly to a two transistor radio frequency power amplifier having generally symmetric bifurcated inputs and outputs which are configured so as to provide desired electrical balance and also having a temperature compensation circuit configured to provide substantially uniform gain over a range of operating temperatures.

BACKGROUND OF THE INVENTION

Radio frequency power amplifiers are commonly used in various applications. Examples of such applications include, broadcasting, satellite and cellular communications. Indeed, some cellular communications systems include video capability. In a radio frequency system, the information signals are modulated onto a carrier frequency. A power amplifier is generally used to amplify the high frequency carrier signal The high frequency carrier signal component commonly used in a cellular system includes a fundamental frequency of few hundred MHz to a few gigahertz. Depending on the application, the bandwidth of the modulating signal component can be from 20 megahertz, such as for multi-carrier W-CDMA applications to 30 kilohertz, such as for cellular communications. Radio frequency bandwidth generally includes the fundamental frequency Second and third harmonics are also possible.

Generally, the presence of higher harmonics is undesirable because they waste power and can be outside the desired bandwidth, where they may interfere with other radio frequency signals.

A radio frequency power amplifier is typically constructed using a printed circuit board, with various components of the radio frequency power amplifier circuit installed on the printed circuit board. The radio frequency power amplifier circuit typically includes an input, an active element, a bias circuit element, an output matching network, and an output. The active element may include an operation amplifier, a power transistor, or another suitable active element known in the art. In operation, an input signal, for example, a video signal or a cellular communications signal, is coupled to the amplifier input, amplified, and the amplified signal is output for broadcast, such as via an antenna.

In most applications a desirable characteristic for power amplifier circuits generally include adequate linearity and efficiency. Linearity is important because the more linear the characteristic of the amplifier, the less signal distortion is introduced as a consequence of amplification. Linearity is generally measured over a band of frequencies.

Conversely, there are circuit elements for which the impedance should be low, or which should vary with frequency in specified ways. As will be discussed herein, certain components within a radio frequency power amplifier circuit require impedances with certain values and/or which vary for different frequencies. For example, to avoid perturbations in a direct current bias voltage within the amplifier circuit, the impedance at the video frequency should be carefully controlled.

In addition, relative physical dimensions of circuit elements and connections within radio frequency power amplifier circuit are an important consideration with respect to the wavelengths of the radio frequency signals to be amplified. The high frequency (and consequently, the short wavelength) of radio frequency signals can lead to significant phase differences appearing in signals, for example, between the opposite ends of a bias feed portion of the radio frequency amplifier circuit. Such phase differences are corrected with the use of appropriate impedance matching.

Additionally, where an impedance mismatch exists between a signal source and a signal destination, according to transmission line theory, the signal may be reflected back along the transmission line connection toward the source. This reflection leads to undesirable signal reflection loss.

In design applications which require both high frequency and high power, it is a challenging task to combine large active transistors with other needed elements. This is particularly true in a radio frequency power amplifier design. Improper combining of such elements causes a multitude of problems, such as unbalanced signal phase and amplitude, multimode oscillations, use of higher loss matching elements, and thermal and electrical memory effects due to improper impedance matching. Unbalanced signal phase and amplitude result in lower realizable gain and degraded gain flatness. Multimode oscillations lead to instabilities in the power amplifier, as well as undesirable out of band signal emissions. In addition, the use of higher loss matching elements leads to appreciable dielectric and metal losses. Lastly, thermal and electrical memory effects due to improper impedance matching results in slower realizable switching speeds, degraded AM-AM, and AM-PM distortion products.

Several approaches to providing DC supply to radio frequency power amplifier design have been evaluated. A first approach includes the use of a quarterwave, i.e., a quarter-wavelength, transmission line. Such a quarterwave solution suffers from high inductance at video frequencies, The high inductance leads to undesirable lower video bandwidth and higher distortion. The high second harmonic impedance leads to higher distortion. The uneven impedance across active cells leads to undesirable thermal imbalance, instability, uneven power, and/or lower gain.

A second approach to providing a radio frequency power amplifier design includes use of the quarterwave transmission line of the first approach, in addition to the use of a parallel tank. Tank circuits provide parasitic elements via the use of bypass capacitors. In this second approach, a bypass capacitor is coupled in parallel to the quarterwave transmission line. Such a parallel tank approach still suffers from undesirably high modulation impedance, undesirably high second harmonic impedance, parasitic loading, lower radio frequency bandwidth, uneven impedance across active cells, and multi-mode oscillations. Further, parasitic loading results in undesirably higher losses.

A third approach makes use of the quarterwave transmission line with electrical field coupling via the use of a dielectric member. Such electrical field coupling suffers from uncontrollable variations and still provides undesirably high modulation impedance, high second harmonic impedance, uneven impedance across cells, and multi-mode oscillations.

As such, it is desirable to provide a radio frequency power amplifier design that substantially mitigates uncontrollable variations in electrical field coupling, modulation impedance, second harmonic impedance, uneven impedance across cells, and multi-mode oscillations.

Cellular communications systems utilize a plurality of radio frequency transceivers to relay information between a wired (or fiber optic) communications network and a plurality of mobile telephones. Each radio frequency transceiver is associated with an antenna, which is typically located upon a tower. The communication range of the transceiver defines a cell.

Such radio frequency power amplifiers receive as an input thereto a low power radio frequency signal. The radio frequency signal may contain voice, data, video or any other desired information. Because of its low power, this signal is not suitable for transmission over the distances commonly encountered in cellular communications systems. Therefore, the low power radio frequency signal must be boosted in power or amplified, to obtain the desired communication range of the cell.

Although such contemporary radio frequency power amplifiers have proven generally suitable for their intended purposes, they possess inherent deficiencies that detract from their overall effectiveness and desirability. For example, the construction of transceiver stations, typically accompanied by a tower upon which the antenna is mounted, is costly. By making the receivers of the transceivers more sensitive and by making the transmitters thereof more powerful, each transceiver can operate over a larger range and each cell can thus be larger. As the cell become larger, the system requires fewer cells. Consequently, this minimizes the cost of building additional transceiver stations.

One contemporary attempt to increase the power output of a radio frequency amplifier involves the use of larger amplifier transistors. However, limitations on the ability to fabricate larger amplifier transistors and the costs associated with the use thereof place limitations on their use in commercial equipment.

Another contemporary attempt to increase the power output of a radio frequency amplifier involves the use of multiple or ganged amplifier transistors. Two or more amplifier transistors are electrically connected in parallel. In this manner, the power outputs of the individual amplifier transistors ideally sum to provide the total power output of the radio frequency power amplifier.

However, when multiple amplifier transistors are utilized, undesirable distortions of the amplified radio frequency signal can result. These distortions of the amplified radio frequency signal can limit the gain of the radio frequency amplifier and can reduce the channel capacity of the radio frequency signals. Among these distortions are those associated with undesirable variations in electrical field coupling, modulation impedance, second harmonic impedance, third harmonic impedance, uneven impedance across cells, and multi-mode oscillations.

As such, although the prior art has recognized, to a limited extent, the problems associated with increasing the power output of transceiver stations, the proposed solutions have, to date, been ineffective in providing a satisfactory remedy. Therefore, it is desirable to provide transceivers having more powerful transmitters that do not suffer substantially from the undesirable effects of distortion of the amplified radio frequency signal.

Additionally, as the temperature of a radio frequency power amplifier changes, its operational characters also change. More particularly, as a radio frequency power amplifier gets hotter, the gain thereof typically decreases substantially.

Such temperature changes can be due to variations in ambient temperature and variations in load. Variations in ambient temperature cause variations in the operating temperature of the amplifier transistor because they vary the ability of the amplifier transistor to dump heat into its environment. The warmer the ambient temperature, the less effectively the amplifier transistor can transfer its own heat to the environment. Consequently, the warmer the ambient temperature, the warmer the amplifier transistor.

As greater demands are placed upon an amplifier transistor, it tends to operate at a higher temperature. An amplifier transistor which is amplifying a higher level input signal will tend to operate at a higher temperature than one which is amplifying a lower lever input signal or no input signal at all. This is because the transistor draws more source-drain current as the amplifier transistor amplifies a higher level input signal than is being drawn as the amplifier transistor amplifies a lower level input signal.

Since the gain of an amplifier transistor decreases as the temperature thereof increases, undesirable distortions of the amplified signal result from such temperature variations.

Thus, it is desirable to provide a radio frequency power amplifier that does not undesirably distort the radio frequency signal amplified thereby due to temperature variation thereof.

BRIEF SUMMARY OF THE INVENTION

The present invention specifically addresses and alleviates the above mentioned deficiencies associated with the prior art.

According to one aspect, the present invention comprises at least one radio frequency power amplifier comprising first and second amplifier transistors. The first and second amplifier transistors have a common element thereof electrically interconnected with a common bus. A forked conductor has two legs thereof electrically connected to the common bus, each leg having a distal end proximate one of the first and second amplifier transistors. The common bus and the forked conductor are generally symmetric about an axis about which the first and second amplifier transistors are symmetrically disposed.

According to one aspect, the present invention comprises a method for forming an input/output conductor for a radio frequency amplifier that forms a conductive conduit configured generally in the fashion of a Y. The Y has two branches. A bus interconnects two distal ends of the branches. The conductive conduit and the bus are configured to be generally symmetric about a line that separates the two branches.

According to one aspect, the present invention comprises a method for amplifying radio frequency signals wherein the method comprises applying a radio frequency signal to a trunk of a conductive conduit; splitting the radio frequency signal into two components, one component being communicated through each of two branches of the conductive conduit; communicating the signal from each branch through a bus, the bus interconnecting distal ends of the branches; and communicating the signal from the bus to inputs of two amplifier transistors. The conductive conduit and the bus are configured to be generally symmetric about a line that separates the two branches.

According to one aspect, the present invention comprises a method for amplifying radio frequency signals wherein the method comprises communicating an amplified radio frequency signal from an output of two amplifier transistors to a bus; communicating the amplified radio frequency signal from the bus to two branches of a conductive conduit, the bus interconnecting distal ends of the branches; combining the amplified radio frequency signal from each branch into a common trunk of the two branches; and providing the combined amplified radio frequency signal as an output of a radio frequency amplifier. The conductive conduit and the bus are configured to be generally symmetric about a line separates the two branches.

According to one aspect, the present invention comprises a method for amplifying radio frequency signals, wherein the method comprises applying a radio frequency signal to a trunk of an input conductive conduit; splitting the radio frequency signal into two components, one component being communicated through each of two branches of the input conductive conduit; communicating the signal from each branch of the input conductive conduit to an input bus, the input bus interconnecting distal ends of the branches of the input conductive conduit; communicating the signal from the input bus to inputs of two amplifier transistors; communicating an amplified radio frequency signal from outputs of the two amplifier transistors to an output bus; communicating the amplified radio frequency signal from the output bus to two branches of an output conductive conduit, the output bus interconnecting distal ends of the branches of the output conductive conduit; combining the amplified radio frequency signal from each branch of the output conductive conduit into a common trunk of the output conductive conduit; and providing the combined amplified radio frequency signal as an output of a radio frequency amplifier. The input conductive conduit and the input bus are configured to be generally symmetric about a line that separates the two branches of the input conduit. The output conductive conduit and the output bus are configured to be generally symmetric about a line separates the two branches of the output conduit.

According to one aspect, the present invention comprises a method for temperature compensation for a radio frequency power amplifier, the method comprising communicating heat from at least one amplifier transistor to a compensation transistor; the bias voltage of the gate input of the amplifier transistor will be compensated through the compensation transistor. As the amplifier transistor increases in temperature, the threshold voltage of the amplifier transistor decreases, so the current of amplifier transistor increases. As the temperature increases, the threshold voltage of compensation transistor also decreases, which will provide a lower bias voltage to amplifier transistor. Therefore the current of amplifier transistor will be decreased and maintained at a constant value over temperature. As temperature decreases, the operation is vice versa.

According to one aspect, the present invention comprises an input/output conductor for a radio frequency amplifier wherein the input/output conductor comprises a bus configured to electrically interconnect two amplifier transistors; and a bifurcated conductor in electrical communication with the bus. Two portions of the bus and two portions of the bifurcated conductor are substantially electrically balanced with respect to one another. A plurality of discrete components are in electrical communication with the bus and/or the bifurcated conductor. The discrete components are also in a balanced configuration with respect to the two portions of the bus and the two portions of the bifurcated conductor.

According to one aspect, the present invention comprises a temperature compensation circuit for a radio frequency power amplifier. The temperature compensation circuit comprises a compensation transistor having an output voltage thereof defining bias voltage of an amplifier transistor, and. The compensation transistor is in thermal communication with the amplifier transistor, such that as the amplifier transistor increases in temperature, the compensation transistor increases in temperature. The compensation transistor preferably comprises a bipolar transistor.

According to one aspect, the present invention comprises a radio frequency power amplifier comprising a first amplifier transistor, a second amplifier transistor and a temperature compensation circuit. The temperature compensation circuit comprises a transistor having an output voltage thereof defining a biased voltage of the first and second amplifier transistors. The temperature compensation circuit further comprises at least one thermal and stability network defining the bias voltage of amplifier transistor.

According to one aspect, the present invention comprises a temperature compensation circuit for a radio frequency power amplifier, wherein the temperature compensation circuit comprises a semiconductor device in thermal communication with at least one amplifier transistor. The semiconductor device is configured so as to compensate the bias current of the amplifier transistor over temperature.

These embodiments, as well as advantages of the present invention, will be more apparent from the following description and drawings. It is understood that changes in the specific structure shown and described may be made within the scope of the claims, without departing from the spirit of the invention.

BRIEF DESCRIPTION OF THE DRAWINGS

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

FIG. 6 is a simplified electrical schematic view of a stability and temperature compensation network of the RF power amplifier according to one embodiment of the present disclosure; and FIG. 7 is a graphical view of drain current versus temperature illustrating temperature compensation for a 100 mm die RF power amplifier according to one embodiment of the present disclosure.

DETAILED DESCRIPTION OF THE PREFERRED EMBODIMENTS

Figure 1:
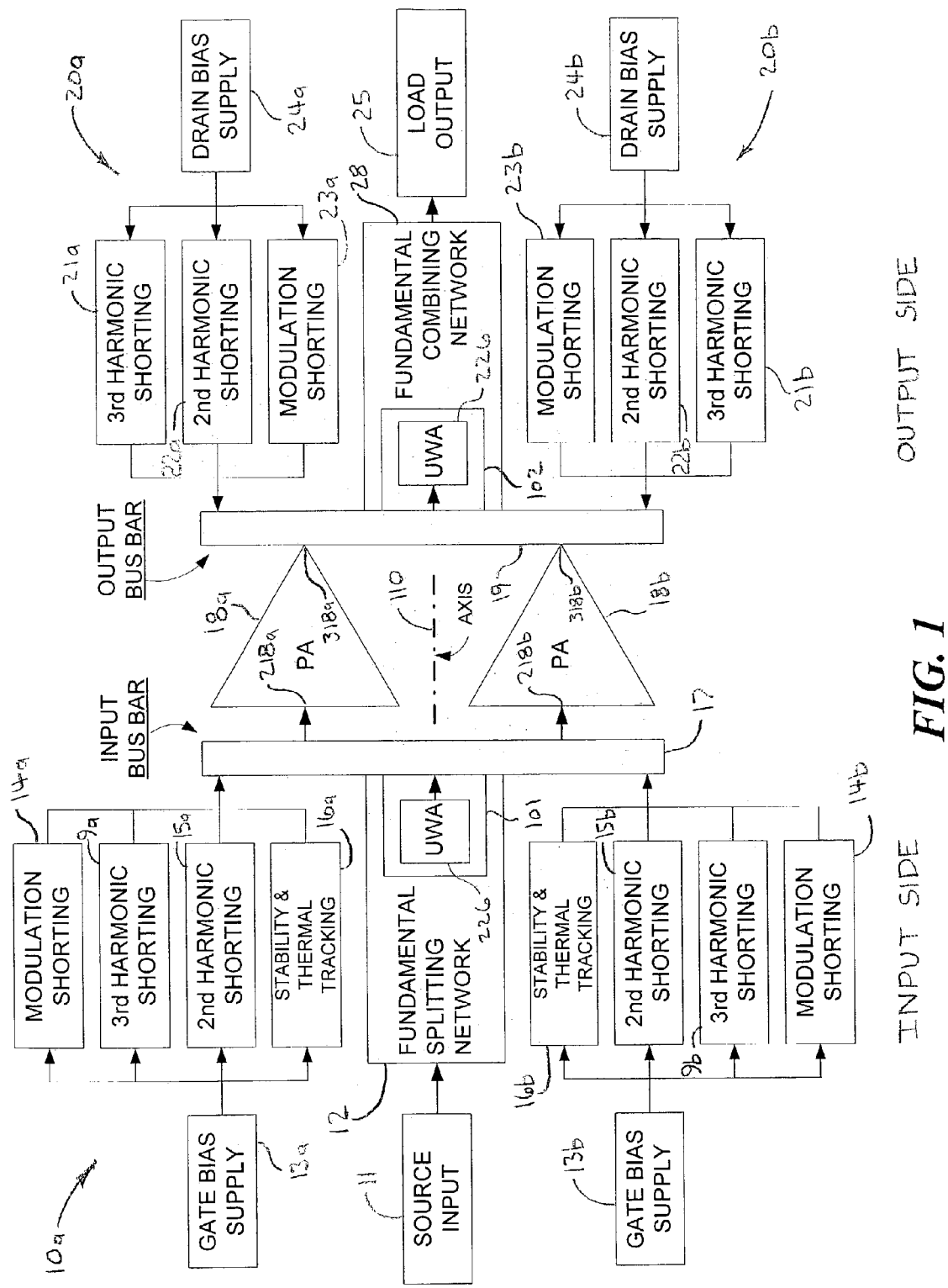
FIG. 1 is a block diagram view of the balanced radio frequency power amplifier according to one embodiment of the present invention.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above, even when not initially claimed in such combinations.

The words used in this specification to describe the invention and its various embodiments are to be understood not only in the sense of their commonly defined meanings, but also to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

Thus, the detailed description set forth below in connection with the appended drawings is intended as a description of the presently preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions may be accomplished by different embodiments that are also intended to be encompassed within the spirit of the invention.

Although described herein as a radio frequency amplifier for amplifying radio frequency signal for use in cellular telephone communications and cellular telephone communication systems, those skilled in the art will appreciate that the balanced radio frequency amplifier with temperature compensation is suited for use in a variety of other applications and corresponding systems. For example, the present invention may be used in point-to-point communications (as opposed to the network communications of a cellular telephone system), satellite and spacecraft communications, and any other desired applications and corresponding systems. Thus, description of the present invention as an amplifier for use in cellular telephone communications and corresponding systems is by way of example only, and not by way of limitation.

According to one aspect, the present invention comprises radio frequency power amplifier comprising first and second amplifier transistors. The first and second amplifier transistors have a common element thereof electrically interconnected with a common bus. A forked conductor has two legs thereof electrically connected to the common bus and each leg has a distal end proximate one of the first and second amplifier transistors. The common bus and the forked conductor are generally symmetric about an axis about which the first and second amplifier transistors are symmetrically disposed.

The forked conductor preferably comprises a trace conductor formed by electroplating. However, those skilled in the art will appreciate that various other types of conductors and various other processes for forming the conductors are likewise suitable.

The two legs of the forked conductor each preferably have a width that is approximately equal to or less than a width of the amplifier transistors.

According to one aspect, the present invention comprises at least one radio frequency power amplifier comprising a first amplifier transistor having an input and an output and a second amplifier transistor having an input and an output. An input conductor is in electrical communication with the inputs of the first and second transistors.

The input conductor comprises a common bus formed proximate the first and second amplifier transistors and in electrical communication with an input of the first and second amplifier transistors, and also comprises a bifurcated conductor formed to the common bus and in electrical communication therewith.

An output conductor is in electrical communication with the outputs of the first and second transistors. The output conductor comprises a common bus formed proximate the first and second amplifier transistors and in electrical communication with a output of the first and second amplifier transistors and also comprises a bifurcated conductor formed to the common bus and in electrical communication therewith.

Both the input conductor and the output conductor are generally symmetric about an axis about which the first and second amplifier transistors are symmetrically disposed.

Preferably the bifurcated conductor comprises a trunk and two branches extending from the trunk, the branches are formed at distal ends thereof to the common bus. Preferably, the branches each have a width that is approximately equal to or less than a width of the amplifier transistors.

Preferably, radio frequency amplifier further comprises an island defined by the bus and the bifurcated conductor and the island comprises a portion of a ground plane.

Preferably, at least one video capacitor is in electrical communication with the bus and the island and the video capacitor is configured to substantially short video frequency signals to ground.

As used herein, video signals are defined according to their well known and customary meaning in the art of radio frequency power amplification.

Preferably, radio frequency power amplifier further comprises at least two second harmonic capacitors, with one second harmonic capacitor on each side of the video capacitor. Each second harmonic capacitor is preferably in electrical communication with the bus and the island and configured to substantially short second harmonics to ground. The island, the video capacitor(s), and the second harmonic capacitors are generally symmetrically disposed about an axis about which the first and second amplifier transistors are symmetrically disposed.

The radio frequency amplifier preferably further comprises an island defined by the bus and the bifurcated conductor and the island comprises a conductive region coupled to a ground plane. At least one video capacitor is in electrical communication with the bus and the island. The video capacitor is configured to substantially short video frequency signals to ground. At least two second harmonic capacitors, one second harmonic capacitor disposed on each side of the video capacitor, are preferably in electrical communication with the bus and the island and configured to substantially short second harmonics to ground. At least two third harmonic capacitors are in electrical communication with the bifurcated conductor and the ground plane and are configured to substantially short third harmonics to ground. The island, the video capacitor(s), the second harmonic capacitors and the third harmonic capacitors are generally symmetrically disposed about an axis about which the first and second amplifier transistors are symmetrically disposed.

In one embodiment, at least one variable capacitor is in electrical communication with the input conductor and with the ground plane. The variable capacitor is configured so as to facilitate enhanced electrical balancing of two generally symmetric portions of the input conductor.

Similarly, at least one variable capacitor is preferably in electrical communication with the output conductor and with the ground plane, the variable capacitor is configured so as to facilitate enhanced electrical balancing of two generally symmetric portions of the output conductor In one embodiment, the first and second amplifier transistors comprise lateral diffusion metal oxide semiconductor field effect transistors. However, those skilled in the art will appreciate that various other types of transistors are likewise suitable.

The outputs of the first and second amplifier transistors preferably comprise drains thereof. However, those skilled in the art will appreciate that the outputs may alternatively comprise sources thereof.

The common bus and the bifurcated conductor are preferably defined by a common layer of conductor formed upon a substrate, for example, a printed circuit board substrate.

Two direct current bias voltage feeds are preferably symmetrically disposed about an axis about which the first and second amplifier transistors are symmetrically disposed.

Preferably, the first amplifier transistor, the second amplifier transistor, the input conductor and the output conductor at least partially define a radio frequency power amplifier module. Preferably, the first amplifier transistor, the second amplifier transistor, the input conductor and the output conductor are contained within a common package.

The ground plane is preferably formed of either CuW and Cu. However, those skilled in the art will appreciate that the ground plane may alternatively be formed of various other conductive materials.

The first amplifier transistor and the second amplifier transistor preferably comprise unpackaged discrete die. Alternatively, the first amplifier transistor and the second transistor comprise packaged devices. Optionally, the first amplifier transistor and the second amplifier transistor are formed upon a common semiconductor substrate.

Optionally, the first amplifier transistor, the second amplifier transistor, the input conductor and the output conductor are formed upon a common printed circuit board.

Preferably, the first amplifier transistor, the second amplifier transistor, the input conductor, the output conductor a gate bias feed and a drain bias feed are formed upon a first side of a single layer printed circuit board and a ground plane is formed upon a second side of the printed circuit board.

According to one aspect, the present invention comprises a temperature compensation circuit for a radio frequency power amplifier, the temperature compensation circuit comprising a semiconductor device in thermal communication with at least one amplifier transistor, the semiconductor device is configured so as to compensate the bias current of the amplifier transistor over temperature.

According to one aspect, the present invention comprises a temperature compensation circuit for a radio frequency power amplifier. The temperature compensation circuit comprises a compensation transistor having an output voltage thereof defining a biased voltage of an amplifier transistor, and at least one thermal tracking and stability network defining biased voltage of the amplifier transistor. The compensation transistor is in thermal communication with the amplifier transistor, such that as the amplifier transistor increases in temperature, the compensation transistor increases in temperature. The compensation transistor preferably comprises a bipolar transistor.

The temperature compensation circuit further comprises a plurality of transistor biasing resistors in electrical communication with the transistor and configured so as to enhance flatness of gain vs. frequency response curves of the transistor at plurality of different temperatures of the transistor.

According to one aspect, the present invention comprises a radio frequency power amplifier comprising a first amplifier transistor, a second amplifier transistor and a temperature compensation circuit. The temperature compensation circuit comprises a transistor having an output voltage thereof defining a biased voltage of the first and second amplifier transistors. The temperature compensation circuit further comprises at least one thermal and stability network defining the bias voltage of amplifier transistor.

A plurality of transistor biasing resistors are preferably in electrical communication with the compensation transistor and are configured so as to enhance a flatness of a frequency response of the transistor to temperature changes of the transistor.

According to one aspect, the present invention comprises a method for forming an input/output conductor for a radio frequency amplifier wherein the method comprises forming a conductive conduit configured generally in the fashion of a Y. The Y has two branches. A bus interconnects two distal ends of the branches. The conductive conduit and the bus are configured to be generally symmetric about a line that separates the two branches.

Preferably, forming the conductive conduit and forming the bus comprise electroplating. Preferably, the conductive conduit and the bus are formed integrally during a common electroplating process.

According to one aspect, the present invention comprises a method for amplifying radio frequency signals wherein the method comprises applying a radio frequency signal to a trunk of a conductive conduit; splitting the radio frequency signal into two components, one component being communicated through each of two branches of the conductive conduit; communicating the signal from each branch through a bus, the bus interconnecting distal ends of the branches; and communicating the signal from the bus to inputs of two amplifier transistors. The conductive conduit and the bus are configured to be generally symmetric about a line separates the two branches.

According to one aspect, the present invention comprises a method for amplifying radio frequency signals wherein the method comprises communicating an amplified radio frequency signal from an output of two amplifier transistors to a bus; communicating the amplified radio frequency signal from the bus to two branches of a conductive conduit, the bus interconnecting distal ends of the branches; combining the amplified radio frequency signal from each branch into a common trunk of the two branches; and providing the combined amplified radio frequency signal as an output of a radio frequency amplifier. The conductive conduit and the bus are configured to be generally symmetric about a line separates the two branches.

According to one aspect, the present invention comprises a method for amplifying radio frequency signals, wherein the method comprises applying a radio frequency signal to a trunk of an input conductive conduit; splitting the radio frequency signal into two components, one component being communicated through each of two branches of the input conductive conduit; communicating the signal from each branch of the input conductive conduit to an input bus, the input bus interconnecting distal ends of the branches of the input conductive conduit; communicating the signal from the input bus to inputs of two amplifier transistors; communicating an amplified radio frequency signal from outputs of the two amplifier transistors to an output bus; communicating the amplified radio frequency signal from the output bus to two branches of an output conductive conduit, the output bus interconnecting distal ends of the branches of the output conductive conduit; combining the amplified radio frequency signal from each branch of the output conductive conduit into a common trunk of the output conductive conduit; and providing the combined amplified radio frequency signal as an output of a radio frequency amplifier. The input conductive conduit and the input bus are configured to be generally symmetric about a line that separates the two branches of the input conduit. Similarly, the output conductive conduit and the output bus are configured to be generally symmetric about a line separates the two branches of the output conduit.

According to one aspect, the present invention comprises a method for temperature compensation for a radio frequency power amplifier, wherein the method comprises communicating heat from at least one amplifier transistor to a compensation transistor; the biased voltage of the gate input of the amplifier transistor will be compensated through the compensation transistor. As the amplifier transistor increases in temperature, the threshold voltage of the amplifier transistor decreases, so the current of amplifier transistor increases. As the temperature increases, the threshold voltage of compensation transistor also decreases, which will provide a lower bias voltage to amplifier transistor. Therefore the current of amplifier transistor will be decreased and maintained at a constant value over temperature. As temperature decreases, the operation is vice versa.

According to one aspect, the present invention comprises an input/output conductor for a radio frequency amplifier wherein the input/output conductor comprises a bus configured to electrically interconnect two amplifier transistors; and a bifurcated conductor in electrical communication with the bus. Two portions of the bus and two portions of the bifurcated conductor are substantially electrically balanced with respect to one another. A plurality of discrete components are in electrical communication with the bus and the bifurcated conductor in various configurations. More particularly, the discrete components are in a balanced configuration with respect to the two portions of the bus and the two portions of the bifurcated conductor.

As mentioned above, increased power output of the radio frequency amplifier can be achieved by providing multiple amplifier transistors. However, the use of multiple amplifier transistors inherently introduces problems with respect to unbalanced phase and amplitude of the outputs thereof, multimode oscillations in the input and output traces of the amplifier transistors, higher than desired loss due to matching elements, as well as thermal and electrical memory effects due to improper matching.

Unbalanced phase and amplitude of the amplifier transistor outputs results in undesirably reduced gain of the power amplifier and degraded flatness of the gain versus frequency curve thereof.

Multimode oscillations result in undesirable instabilities in amplifier operation and may also result in out of band emissions.

Appreciable dielectric and metal losses result in higher than desired loss from matching elements. This, of course, undesirably reduces the efficiency of the radio frequency power amplifier.

The thermal and electrical memory effect caused by improper matching causes undesirably slower switching speed, worsened AM-AM and worsened AM-PM distortion products.

Thus, according to one aspect of the present disclosure, the radio frequency power amplifier with matching structure as described herein provides for one or more of the following: reduction in radio frequency distortions, reduction in envelope frequency distortion, reduction in thermal related distortion, increase in gain and increase in power.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The present invention is illustrated in FIGS. 1–7, which depict a presently preferred embodiment thereof. This configuration of the present invention mitigates the above mentioned undesirable distortions of the amplified radio frequency signal by providing a physically symmetric structure which is electrically balanced or matched.

Figure 2:
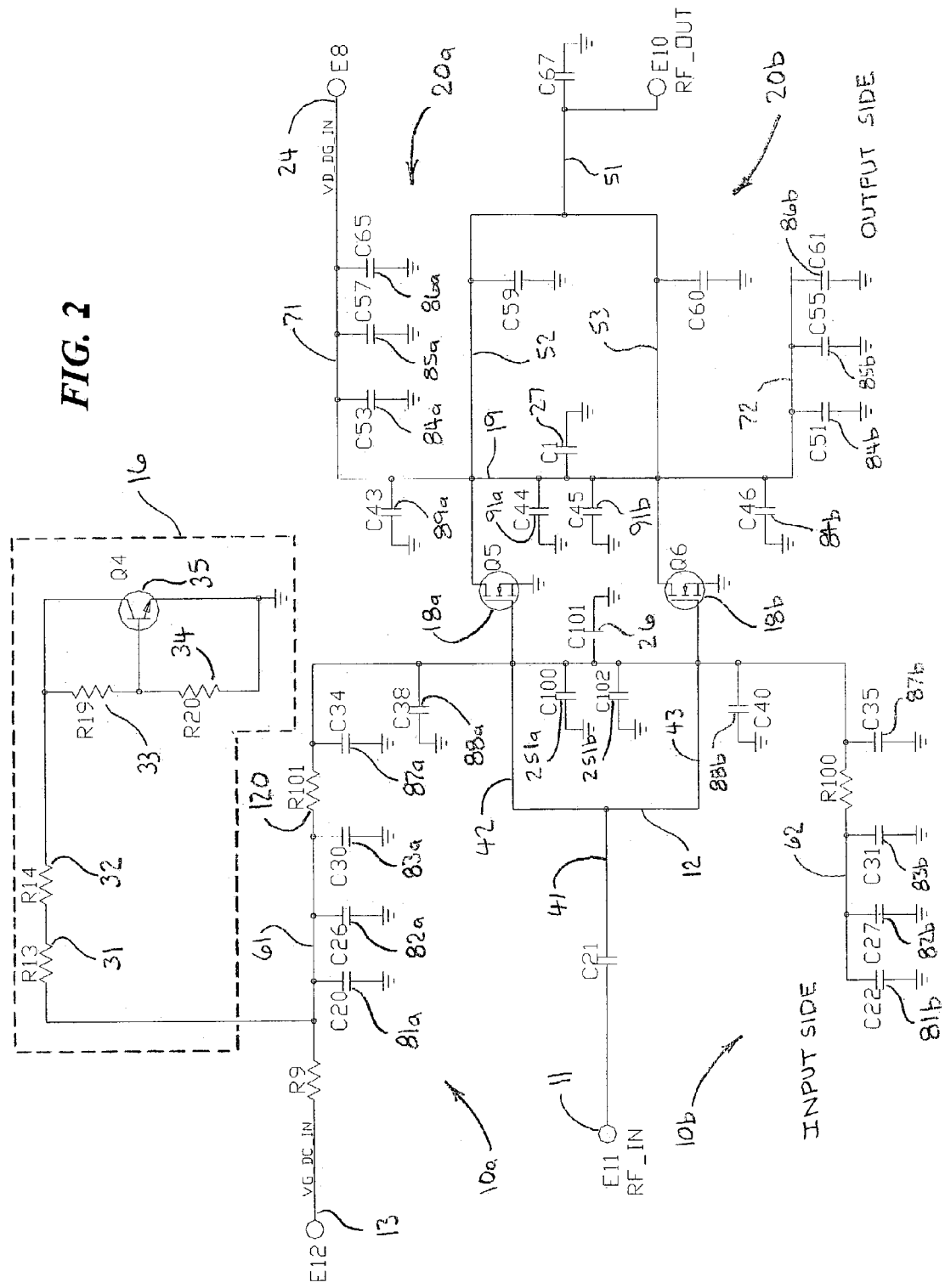
FIG. 2 is an electrical schematic diagram view of the balanced RF power amplifier with temperature compensation according to one embodiment of the present disclosure.
Figure 3:
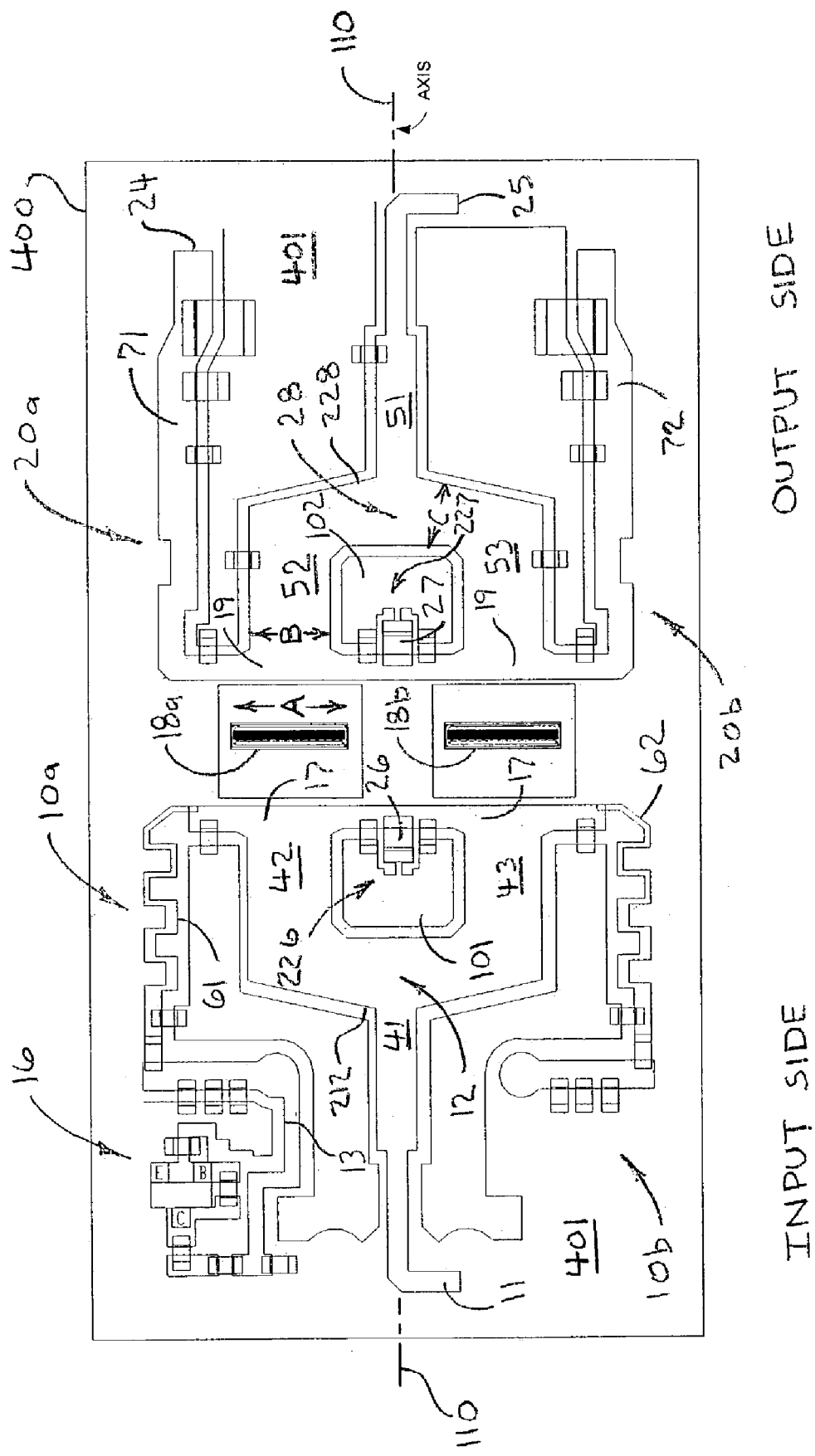
FIG. 3 is a physical layout view of the balanced RF power amplifier according to one embodiment of the present disclosure.

Referring now to FIGS. 1–3, according to one embodiment of the present invention, a radio frequency power amplifier includes a first amplifier transistor 18a, a second amplifier transistor 18b, a splitting network 12 coupled to the inputs of first and second amplifier transistors on an input side of the RF power amplifier, and a combining network 28 coupled to the outputs of the first and second amplifier transistors on an output side of the RF power amplifier. The first amplifier transistor 18a has an input 218a and an output 318a. The second amplifier transistor 18b has an input 218b and an output 318b. In addition, the first and second amplifier transistors are mounted upon a printed circuit board 400 (FIG. 3), so as to define an axis 110 about which the first and second amplifier transistors are symmetrically disposed.

The splitting network electrically couples to the inputs 218a, 218b of the first and second amplifier transistors 18a, 18b respectively, for distributing an input signal received at the source input 11 of the RF power amplifier between the first and second amplifier transistors 18a, 18b. The splitting network 12 is configured to substantially equally distribute the input signal between the inputs of the first and second amplifier transistors. In addition, the splitting network 12 is substantially symmetrically disposed about the axis 110.

More particularly, in one embodiment, the splitting network 12 includes a bifurcated conductor, generally referred to by reference numeral 212. The bifurcated conductor 212 includes a metal trace conductor having a trunk portion 41 and two branch portions 42 and 43. The trunk portion 41 couples to the two branch portions 42 and 43. Furthermore, each branch portion 42 and 43 has a width dimension, indicated by reference letter B (preferably, the dimensions of the branches 42, 43 of the splitting network 12 are approximately equal to the dimensions of the branches 52, 53 of the combining network), which is on the order of less than or equal to a width dimension of a corresponding first or second amplifier transistor, indicated by reference letter A.

The radio frequency power amplifier also includes first and second input side transmission lines 61 and 62, respectively. The first and second transmission input side lines are disposed on an input side of the RF power amplifier. The first and second input side transmission lines are substantially symmetrically disposed at opposite ends of an input bus bar 17. In addition, each of the first and second transmission input side lines is configured to have a length on the order of one-half wavelength at a third harmonic frequency component short at the input bus bar 17.

The input bus bar 17 is common to the inputs 218a and 218b, respectively, of the first and second amplifier transistors. That is, the first and second amplifier transistor inputs are electrically coupled in common to the input bus bar 17. In addition, the input bus bar 17 includes a bus bar disposed perpendicular to the axis 110. Furthermore, input bus bar 17 electrically couples the splitting network 12 to the inputs of the first and second amplifier transistors. Moreover, in one embodiment, the input bus bar 17 is substantially symmetrically disposed about the axis 110. In another embodiment, the input bus bar 17 is integrally formed with the splitting network 12.

The RF amplifier further includes at least one input bias supply. In one embodiment, the amplifier transistors 18a and 18b include lateral diffusion metal oxide semiconductor field effect transistors, wherein the at least one input bias supply comprises a gate bias supply 13a. As shown in FIG. 1, two input bias supplies can optionally be provided.

In addition to the gate bias supply 13a on the input side, the RF power amplifier still further includes modulation shorting means or modulation shorts 14a, 14b; third harmonic shorts 9a, 9b, second harmonic shorts 15a, 15b, and stability and thermal tracking networks 16a, 16b. The modulation shorts 14a, 14b include means for shorting a modulation frequency component on the input side of the RF amplifier, the modulation shorts 14a, 14b being electrically coupled between the input bias supply 13a, 13b and the input bus bar 17. The modulation shorting means 14a, 14b is also substantially symmetrically disposed about the axis 110. In one embodiment, the modulation shorting means 14a, 14b comprises a variable capacitor 26 (FIG. 2). In another embodiment, the modulation shorting means 14a, 14b comprises a fixed capacitor.

The RF amplifier further includes a means 9a, 9b for shorting a third harmonic frequency component of the modulation frequency. The third harmonic shorting means 9a, 9b is electrically coupled between the input bias supply 13a, 13b and the input bus bar 17, wherein the third harmonic shorting means 9a, 9b is substantially symmetrically disposed about the axis 110. In one embodiment, the third harmonic shorting means 9a, 9b includes third harmonic impedance shorts that are substantially symmetrically (i) balanced and (ii) disposed about the axis 110.

The RF amplifier still further includes a means 15a, 15b for shorting a second harmonic frequency component of the modulation frequency. The second harmonic shorting means 15a, 15b is substantially symmetrically disposed about the axis 110. Still further, the second harmonic shorting means 15a, 15b is electrically coupled between the input bias supply 13a, 13b and the input bus bar 17. In one embodiment, the second harmonic shorting means 15a, 15b includes second harmonic impedance shorts that are substantially symmetrically (i) balanced and (ii) disposed about the axis 110.

With reference still to the input side, the RF amplifier further includes stability and thermal tracking networks 16a, 16b electrically coupled between a respective input bias supply 13a, 13b and the input bus bar 17. The stability and tracking networks 16a, 16b are substantially symmetrically disposed about the axis 17. In one embodiment, the stability and thermal tracking networks 16a, 16b include LRC networks that are substantially symmetrically disposed about the axis 17. Still further, the inductor (L) of the LRC networks includes transmission line inductors 61, 62, as will be discussed further herein below.

The RF amplifier still further includes a means 226 for absorbing an undesired wave on an input side of the first and second amplifier transistors 18a, 18b. The undesired wave absorption means 226 is proximate the input bus bar 17. In addition, the undesired wave absorption means 226 is substantially symmetrically disposed about the axis 110. In one embodiment, the undesired wave absorption means 226 includes a ground plane structure proximate the input bus bar 17. The ground plane structure further comprises a conductive island 101 disposed about the axis 110 and within a region surrounded by a combination of the input bus bar 17 and the splitting network 12. Still further, in one embodiment, the ground plane also comprises a conductive sub-island 231 electrically coupled to a main body of the conductive island 101. The sub-island 231 is disposed in a recess 233 within an outer boundary of the main body of the conductive island 101 and provides a contact region for an electrical component coupled between the conductive island 101 and the input bus bar 17.

In one embodiment, the ground plane structure 401 (FIG. 3) is configured as an inductor to influence RF frequency and modulation frequency components. The inductor acts like a short at the modulation frequency (i.e., a modulation short), and the inductor further acts like an impedance at the RF frequency.

On the output side, the RF power amplifier includes a combining network 28 electrically coupled to the outputs 318a and 318b of the first and second amplifier transistors 18a and 18b, respectively. The combining network 28 combines the two separate output signals from the first and second amplifier transistors into a single output signal of the RF power amplifier at load output 25. In one embodiment, the combining network 28 substantially equally combines the output signals from the first and second amplifier transistors. In another embodiment, the combining network 28 is substantially symmetrically disposed about the axis 110.

In another embodiment, the combining network 28 includes a bifurcated conductor, generally indicated by reference numeral 228. The bifurcated conductor 228 includes two branch portions 52, 53 and a trunk portion 51. The branch portions 52, 53 are coupled to the trunk portion 51, and wherein each branch portion 52, 53 has a width dimension, indicated by the reference letter B, on the order of less than or equal to a width dimension, indicated by the reference letter A, of a corresponding amplifier transistor.

The radio frequency power amplifier also includes third and fourth transmission lines 71 and 72, respectively, disposed on an output side of the RF power amplifier. The third and fourth transmission lines are substantially symmetrically disposed at opposite ends of an output bus bar 19. In addition, each of the third and fourth transmission lines is configured to have a length on the order of one-half wavelength at a third harmonic frequency component short at the output bus bar 19.

The output bus bar 19 is common to the outputs 318*a* and 318*b* of the first and second amplifier transistors 18*a* and 18*b*, respectively. That is, the first and second amplifier transistor outputs are electrically coupled in common to the output bus bar 19. In addition, the output bus bar 19 includes a bus bar disposed perpendicular to the axis 110. Furthermore, the output bus bar electrically couples the combining network 28 to the outputs 318*a* and 318*b* of the first and second amplifier transistors 18*a* and 18*b*, respectively. In another embodiment, the output bus bar 19 is substantially symmetrically disposed about the axis 110. In another embodiment, the output bus bar 19 is integrally formed with the combining network 28.

The RF power amplifier further includes at least one output bias supply. As shown in FIG. 1, RF power amplifier includes drain bias supply 24*a* and drain bias supply 24*b*. In one embodiment, the amplifier transistors 18*a* and 18*b* include lateral diffusion metal oxide semiconductor field effect transistors, wherein the output bias supply comprises a drain bias supply 24*a*, 24*b*.

In addition to the drain bias supply 24*a*, 24*b*, on the output side, the RF amplifier still further includes modulation shorts 23*a*, 23*b*, third harmonic shorts 21*a*, 21*b*, and second harmonic shorts 22*a*, 22*b*. The modulation shorts 23*a*, 23*b* include means for shorting a modulation frequency component on the output side of the RF amplifier, the modulation shorts being electrically coupled between the output bias supply 24*a*, 24*b* and the output bus bar 19. The modulation shorting means 23*a*, 23*b* is also substantially symmetrically disposed about the axis 110. In one embodiment, the modulation shorting means 23*a*, 23*b* comprises a fixed capacitor 27. Alternatively, the modulation shorting means 23*a*, 23*b* may comprise a variable capacitor.

The RF amplifier still further includes a means 21*a*, 21*b* for shorting a third harmonic frequency component of the modulation frequency. The third harmonic shorting means 21*a*, 21*b* is electrically coupled between the output bias supply 24*a*, 24*b* and the output bus bar 19, wherein the third harmonic shorting means 21*a*, 21*b* is substantially symmetrically disposed about the axis 110. In one embodiment, the third harmonic shorting means 21*a*, 21*b* includes third harmonic impedance shorts that are substantially symmetrically (i) balanced and (ii) disposed about the axis;

The RF amplifier still further includes a means 22*a*, 22*b* for shorting a second harmonic frequency component of the modulation frequency. The second harmonic shorting means 22*a*, 22*b* is substantially symmetrically disposed about the axis 110. Still further, the second harmonic shorting means 22*a*, 22*b* is electrically coupled between the output bias supply 24*a*, 24*b* and the output bus bar 19. In one embodiment, the second harmonic shorting means 22*a*, 22*b* includes second harmonic impedance shorts that are substantially symmetrically (i) balanced and (ii) disposed about the axis 110.

The RF amplifier still further includes a means 227 for absorbing an undesired wave on an output side of the first and second amplifier transistors 18*a* and 18*b*, respectively. The undesired wave absorption means 227 is proximate the output bus bar 19 and further being substantially symmetrically disposed about the axis 110. In one embodiment, the undesired wave absorption means 226 includes a ground plane structure proximate the output bus bar 19. The ground plane structure further comprises a conductive island 102 disposed about the axis 110 and within a region surrounded by a combination of the output bus bar 19 and the combining network 28. Still further, in one embodiment, the ground plane further comprises a conductive sub-island 232 (FIG. 4) electrically coupled to a main body of the conductive island 102. The sub-island 232 is disposed in a recess within an outer boundary of the main body of the conductive island 102 and provides a contact region for an electrical component coupled between the conductive island 102 and the output bus bar 19.

In one embodiment, the ground plane structure 401 is configured as an inductor to influence RF frequency and modulation frequency components. The inductor acts like a short at the modulation frequency (i.e., a modulation short), and the inductor further acts like an impedance at the RF frequency With particular reference to FIG. 1, both the input side and the output side of the radio frequency power amplifier are configured in a generally symmetric fashion, so as to provide a balanced configuration thereof. That is, an upper portion 10*a* of the input side is configured so as to be generally symmetric with respect to a lower portion 10*b* of the input side and in a similar fashion an upper portion 20*a* of the output side is configured to be generally symmetric with respect to a lower portion 20*b* of the output side. This symmetry includes both a generally symmetry of conductive traces and a general symmetry of component placements and values.

In this manner, the problems of undesirable phase shifts associated with unbalanced phase and amplitude of the outputs of the power amplifier, multimode oscillations in the input and output traces of the amplifier transistors, higher than desired loss due to matching elements, as well as thermal and electrical memory effects due to improper matching, are substantially mitigated.

Unbalanced phase and amplitude are substantially mitigated because the symmetric structure of the present invention inherently tends to balance the phase and amplitude of the output signal of the power amplifier. Thus, such distortion is mitigated because the substantially identical physical structures of the input side and the output side of the radio frequency power tend to affect radio frequency signals in substantially similar ways. That is, the phase and the amplitude of the input radio frequency signal is modified in a similar fashion by the upper portion 10*a* and the lower portion 10*b* of the input side, as well as by the upper portion 20*a* and the lower portion 20*b* of the output side.

According to the present invention, the physical symmetry of the radio frequency power amplifier results in an electrical balance between a first portion of the circuitry associated with one of the amplifier transistors and a second similar portion of the circuitry associated with the other amplifier transistor. Since the circuitry associated with each amplifier transistor is thus electrically similar, i.e., balanced or matched, the circuitry associated with each amplifier transistor causes similar changes in the phase and amplitude of the radio frequency signals communicated therethrough.

Multimode oscillations are mitigated by the symmetric physical structure of the present invention. The Y shaped conductors of the symmetric physical structure thereof tend to minimize the physical dimensions of each input and output trace. The gate input is split into two portions by the fundamental splitting network 12 and in a similar fashion the drain output is split into two portions by the fundamental combining network 28.

Appreciable dielectric and metal losses are mitigated because the electrical balance provided by the symmetric construction of the present invention tends to minimize the need for additional matching elements. That is, the configuration of the physical structure of the radio frequency power amplifier tends to provide sufficient electrical balance such that the need for additional impedance matching elements is mitigated.

The thermal and electrical memory effect caused by improper matching is similarly mitigated by the symmetric physical configuration of the present invention and the consequent electrical balance thereof, such that the undesirable effects of undesirably slower switching speed, worsened AM-AM and worsened AM-PM distortion products are substantially mitigated.

According to the present invention, a low power radio frequency input signal is provided to source or input 11 of the radio frequency power amplifier. The low power radio frequency signal is then split by the fundamental splitting network 12 into two components. One component of the input signal is provided to the upper or first amplifier transistor 18*a* and the other component thereof is provided to the lower or second amplifier transistor 18*b*.

The fundamental combining network 28 provides an amplified or high power radio frequency output signal to the load or output 25 of the radio frequency power amplifier. One component of the output signal comes from the upper or first amplifier transistor 18*a* and the other component thereof comes from the lower or second amplifier transistor 18*b*.

More particularly, the fundamental splitting network 12 cooperates with input bus bar 17 to define an input conductor and the fundamental combining network 28 cooperates with an output bus bar 19 to define an output conductor. Both the input conductor and the output conductor are symmetrically configured and electrically balanced.

Preferably, the gate bias supply 13*a*, 13*b* and the drain bias supply 24*a*, 24*b* are also configured to be symmetrically and electrically balanced.

Low modulation and third harmonic impedances 14*a*, 14*b*, as well as second harmonic shorts 15*a*, 15*b*, on the input side are symmetrically positioned with respect to the input conductor. Similarly, third harmonic shorts 21*a*, 21*b*, second harmonic shorts 22*a*, 22*b*, and modulation shorts 23*a* and 23*b* are symmetrically positioned with respect to the output conductor.

In a similar fashion, stability and thermal tracking network 16*a*, 16*b* is preferably formed in a symmetric fashion with respect to the input conductor. Alternatively, the stability and thermal tracking network 16*a*, 16*b*, as well as other ancillary circuitry, may be formed asymmetrically with respect to the input and/or output conductor. Optionally, matching components, such as one or more capacitors or inductors (one or more of which may optionally be variable), are provided to compensate for any mismatch of electrical characteristics due to any asymmetry introduced by the stability and thermal tracking network and/or any other circuitry.

The block diagram of FIG. 1 illustrates an ideal configuration of the radio frequency power amplifier of the present invention. By way of contrast, the electrical schematic of FIG. 2 and the physical layout of FIG. 3 illustrate exemplary embodiments of the present invention. It is worthwhile to note that the exemplary embodiments FIGS. 2 and 3 do not necessarily contain all of the features shown in the block diagram of FIG. 1. For example, The block diagram of FIG. 1 shows the gate bias supply 13*a*, 13*b* and the drain bias supply 24*a*, 24*b* to be symmetric, while the exemplary embodiment of FIGS. 2 and 3 show some asymmetry with respect to the gate bias supply 13 and the drain bias supply 24. Thus, while it is generally desirable to maintain as much symmetry as possible in the design of a radio frequency power amplifier, in practice in is sometimes not practical to maintain complete symmetry.

With particular reference to FIG. 2, an electrical schematic shows the individual components of the present invention and their electrical interconnections.

A gate bias feed 61 communicates a gate bias voltage from the gate bias supply 13 of the upper portion 10*a* of the input side to the two amplifier transistors 18*a* and 18*b*. A transmission line 62 at least partially mirrors the gate bias feed 61 to enhance the symmetry and electrical balance of the input side. In one embodiment, transmission line 62 is made to have a conductive trace length on the order of less than a quarter wave transmission line.

A drain bias feed 71 similarly communicates a drain bias voltage from the drain bias supply 24 of the upper portion 20*a* of the output side to the two amplifier transistors 18*a* and 18*b*. A transmission line 72 at least partially mirrors the gate bias feed 61 to enhance electrical balance of the output side. In one embodiment, transmission line 72 is made to have a conductive trace length on the order of one half wavelength at a third harmonic.

However, as an alternative, two separate gate bias feeds and/or two separate drain bias feeds may be utilized to further enhance the symmetry and electrical balance of the radio frequency power amplifier of the present invention. In this instance, two separate gate bias supplies 13*a* and 13*b* (one connected to the gate bias feed 61 and one connected to the transmission line 62) and two separate drain bias supplies 25*a* and 25*b* (one connected to the drain bias feed 71 and one connected to the transmission line 72) are used, as shown in FIG. 1.

On the input side, capacitor 81*a*, capacitor 82*a*, capacitor 83*a* and capacitor 88*a* are harmonic shorting capacitors connected between the upper gate bias feed 61 and the ground plane. Similarly, capacitor 81*b*, capacitor 82*b*, capacitor 83*b* and capacitor 88*b* are harmonic shorting capacitors connected between the upper gate bias feed 61 and the ground plane. Each capacitor forms a resonant circuit with the inherent circuit impedances so as to effectively short the desired band of frequencies to ground.

On the output side, second harmonic capacitors 89*a*, 91*a*, third harmonic capacitor 84*a*, and video capacitors 85*a*, 86*a* are connected between the upper drain bias feed 71 and the ground plane. Similarly, second harmonic capacitors 89*b*, 91*b*, third harmonic capacitor 84*b*, and video capacitors 85*b*, 86*b* are connected between the lower drain bias feed 72 and the ground plane. As above, each capacitor forms a resonant circuit with the inherent circuit impedances so as to effectively short the desired band of frequencies to ground.

As discussed in detail below, on the input side a variable video capacitor is connected between the input bus 17 and an input side island and a fixed video capacitor is similarly connected between the output bus 19 and an output side island 102.

A temperature compensation circuit 16 mitigates undesirable variations in the response of the radio frequency power amplifier of the present invention. That is, the temperature compensation circuit tends to make a drain current versus temperature curve for the amplifier transistors 18a and 18b more nearly flat than this curve would be without such a circuit.

The temperature compensation circuit 16 thus tends to make the gain of the radio frequency power amplifier more stable as the temperature of the radio frequency power amplifier changes. Of course, such stability in the gain of the radio frequency power amplifier is desirable, since a desired and predetermined power output would be otherwise difficult to obtain.

The temperature compensation circuit 16 comprises a temperature compensation transistor 35 that compensates the gate voltage changes to the amplifier transistors 18a and 18b as the temperature of the radio frequency power amplifier changes. The temperature compensation transistor 35 is in thermal communication with at least one of the amplifier transistors 18a and 18b, such that when the temperature of the amplifier transistors 18a and 18b increases, the temperature of the temperature compensation transistor 35 likewise also increases and visa versa.

Resistors 31 and 32 limit the amount of current that is shorted to ground through the temperature compensation transistor 35. Preferably, two resistors are used in the current limiting capacity so as to more cost effectively obtain the desired resistance value. As those skilled in the art will appreciate, it is generally less costly to obtain a desired resistance by using a larger resistor having approximately the desired value and a smaller resistor having a value approximately equal to the difference in value between the larger resistor and the desired value than to purchase a single resistor having the desired value.

With particular reference FIG. 3, a diagram of the preferred physical layout of the balanced radio frequency amplifier of the present invention shows how the circuitry and conductors, i.e., traces, are symmetrically configured so as to provide electrical balance on both the input side and the output side.

On the input side, a bifurcated input conductor is at least partially defined by the fundamental splitting network 12 and comprises a trunk 41 from which the input signal is split onto two branches 42 and 43. An input bus interconnects the two distal ends of the branches 42, 43 and provides electrical connection between the input conductor and the gates of the amplifier transistors 18a, 18b. Both the trunk 41, the two branches 42 and 43, and the input bus 17 are generally symmetric with respect to a line about which the upper 18a and lower 18b amplifier transistors are positioned. That is, the bifurcated input conductor is bilaterally symmetric about a longitudinal (horizontal in FIG. 3) line 110 and the two amplifier transistors 18a and 18b are positioned symmetrically about this same line.

The branches 42 and 42 cooperate with the input bus 17 to define an island 101. The island 101 comprises a conductive region that is in electrical communication with the ground plane and effectively forms a portion of the ground plane. Thus, as shown, video capacitor 26 shorts video frequencies to ground.

On the output side, a bifurcated input conductor is at least partially defined by the fundamental combining network 28 and comprises a trunk 51 from which the output signal is combined from two branches 52 and 53. An output bus interconnects the two distal ends of the branches 52, 53 and provides electrical connection between the output conductor and the drains of the amplifier transistors 18a, 18b. Both the trunk 51, the two branches 52 and 53, and the output bus 19 are generally symmetric with respect to a line about which the upper 18a and lower 18b amplifier transistors are positioned. That is, the bifurcated input conductor is bilaterally symmetric about a longitudinal (horizontal in FIG. 3) line 110 and the two amplifier transistors 18a and 18b are positioned symmetrically about this same line.

The branches 52 and 53 cooperate with the output bus 19 to define an island 227. The island 227 comprises a conductive region that is in electrical communication with the ground plane and effectively forms a portion of the ground plane. Thus, as shown, video capacitor 27 shorts video frequencies to ground.

Figure 4:
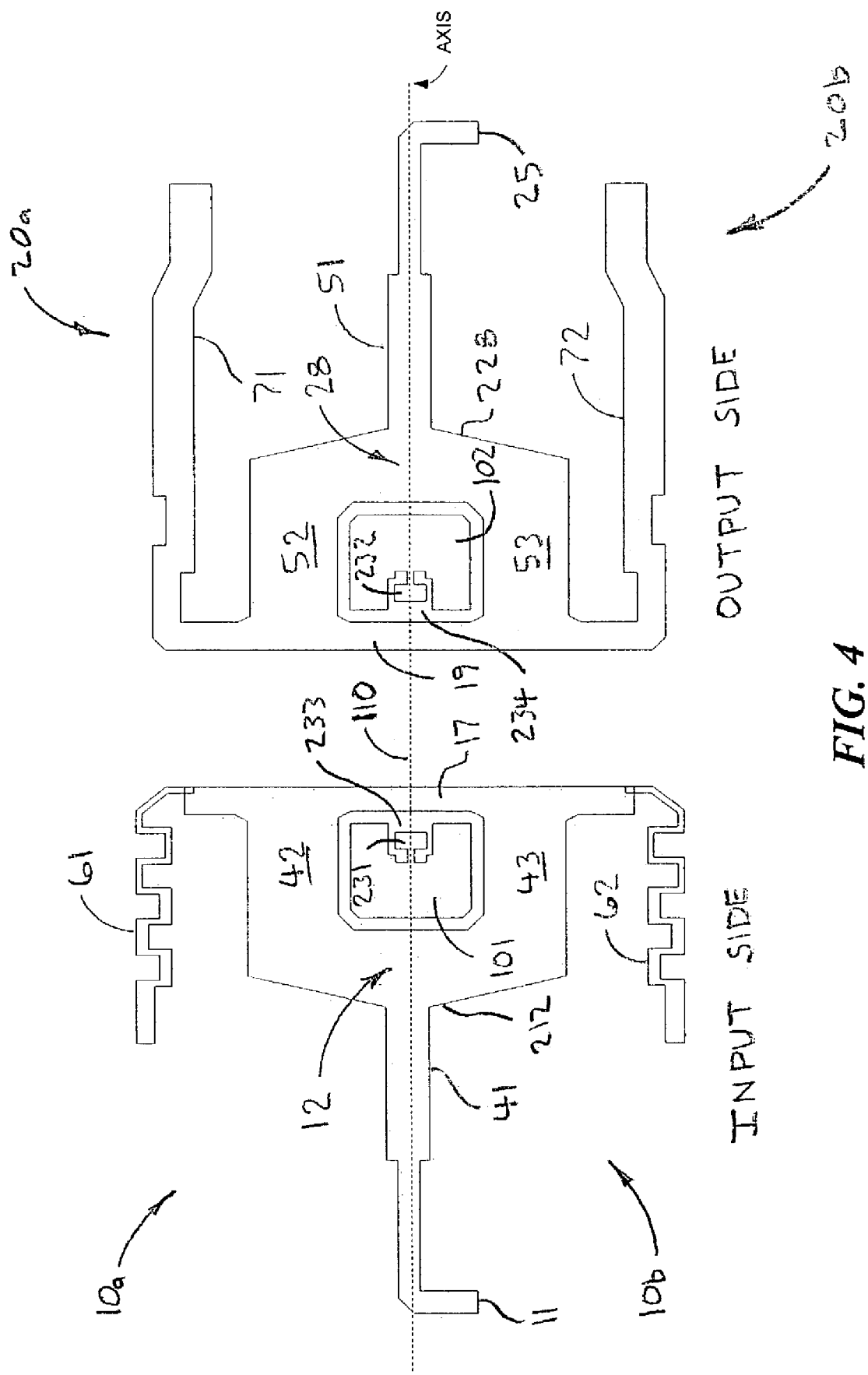
FIG. 4 is a physical layout view of the conductive traces of the RF power amplifier according to one embodiment of the present disclosure.
Figure 5:
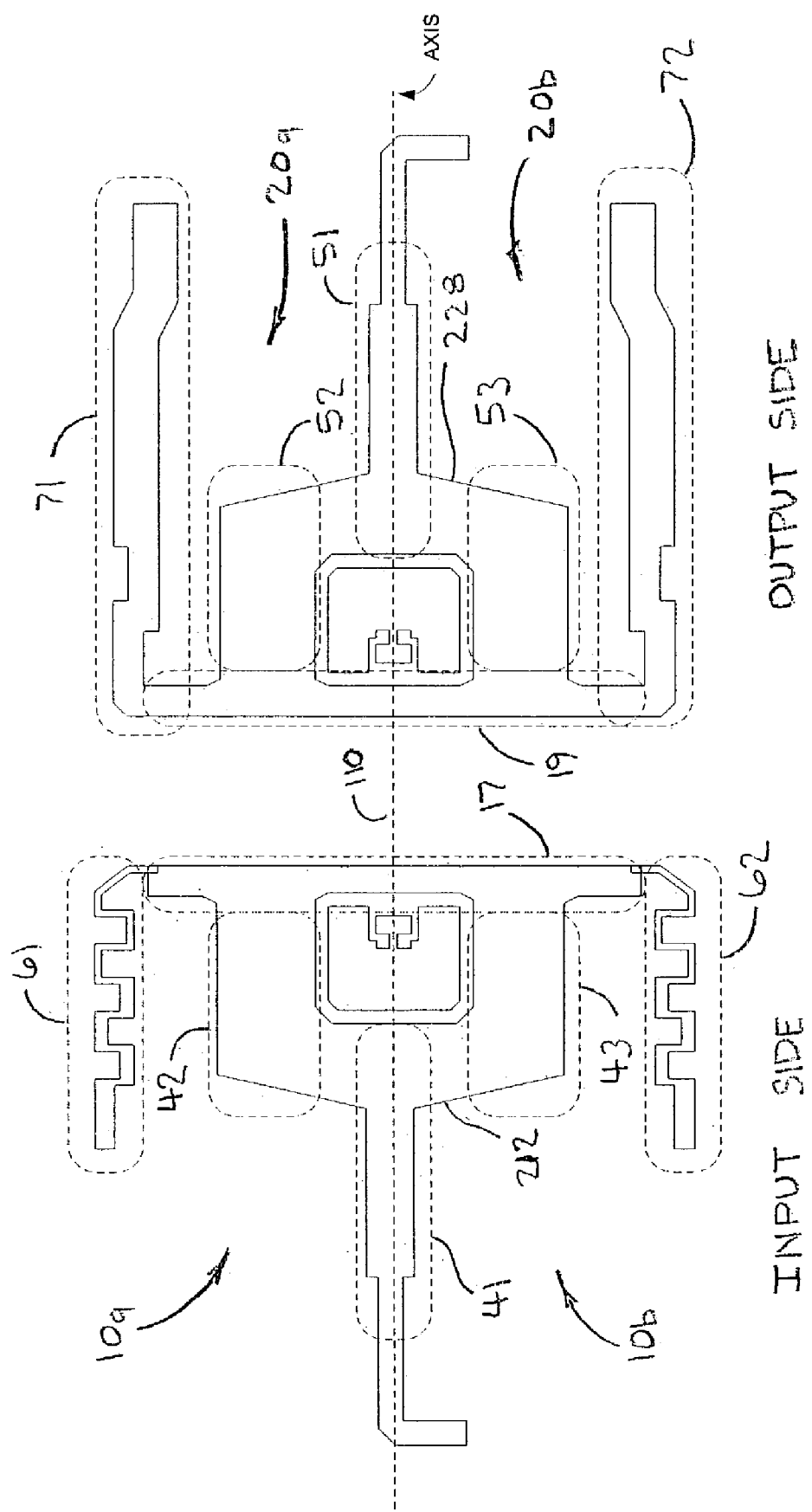
FIG. 5 is the physical layout view of the conductive traces of the RF power amplifier of FIG. 4 more particularly identifying the various portions thereof.

FIG. 4 is a physical layout view of the conductive traces of the RF power amplifier according to one embodiment of the present disclosure. The conductive traces include conductive traces on the input side and output side of the RF power amplifier. The conductive traces on each of the input side and output side are substantially symmetrical about the axis 110, as discussed earlier herein. FIG. 5 is the physical layout view of the conductive traces of the RF power amplifier of FIG. 4, more particularly identifying the various portions thereof.

On the input side, splitting network 12 includes a first bifurcated conductor 212. The first bifurcated conductor 212 includes a trunk portion 41 and two branch portions 42 and 43. As illustrated, the trunk portion 41 is coupled to and integral with the two branch portions 42 and 43. In addition, each branch portion 42, 43 has a width dimension (B of FIG. 3—noting that the dimensions of the branches 42, 43 of the bifurcated conductor 212 are approximately the same as the dimensions of the branches 52, 53 of the second bifurcated conductor 228) on the order of less than or equal to a width dimension of a corresponding amplifier transistor. The input bus bar 17 is disposed perpendicular to the axis 110. As discussed elsewhere herein, the first and second amplifier transistor inputs are electrically coupled in common to the input bus bar 17. Furthermore, the splitting network 12 electrically couples the inputs of the first and second amplifier transistors via the input bus bar 17. Still further, the conductive trace includes first and second transmission lines 61 and 62, that are substantially symmetrically disposed at opposite ends, respectively, of the input bus bar 17.

As shown in FIG. 5, the conductive trace includes means for absorbing an undesired wave on an input side of the first and second amplifier transistors. The undesired wave absorption means is proximate the input bus bar 17 and is further substantially symmetrically disposed about the axis 110. In addition, the undesired wave absorption means includes a ground plane structure proximate the input bus bar 17, wherein the ground plane structure comprises a conductive island 101 disposed about the axis 110 and within a region surrounded by a combination of the input bus bar 17 and the splitting network 12. Still further, in one embodiment, the ground plane further comprises a conductive sub-island 231 electrically coupled to a main body of the conductive island 101. The sub-island 231 is disposed in a recess within an outer boundary of the main body of the conductive island 101 and provides a contact region for an electrical component coupled between the conductive island 101 and the input bus bar 17.

On the output side, combining network 28 includes a second bifurcated conductor 228, the second bifurcated conductor having two branch portions 52, 53 and a trunk portion 51. The branch portions 52, 53 are coupled to and integral with the trunk portion 51. In addition, each branch portion 52, 53 has a width dimension on the order of less than or equal to a width dimension of a corresponding amplifier transistor. The output bus bar 19 is disposed perpendicular to the axis 110. As discussed elsewhere herein, the first and second amplifier transistor outputs are electrically coupled in common to the output bus bar 110. Furthermore, the combining network 28 electrically couples the outputs of the first and second amplifier transistors via the output bus bar 19. Still further, the conductive trace includes third and fourth transmission lines 71 and 72, that are substantially symmetrically disposed at opposite ends, respectively, of the output bus bar 19.

Also as shown in FIG. 5, the conductive trace includes a means for absorbing an undesired wave on an output side of the first and second amplifier transistors. The undesired wave absorption means is proximate the output bus bar 19 and is further substantially symmetrically disposed about the axis 110. In addition, the undesired wave absorption means includes a ground plane structure proximate the output bus bar 19, wherein the ground plane comprises a conductive island 102 disposed about the axis 110 and within a region surrounded by a combination of the output bus bar 19 and the combining network 28. Still further, in one embodiment, the ground plane further comprises a conductive sub-island 232 electrically coupled to a main body of the conductive island 102. The sub-island 232 is disposed in a recess within an outer boundary of the main body of the conductive island 102 and provides a contact region for an electrical component coupled between the conductive island 102 and the output bus bar 19.

Referring now to FIG. 6, a simplified (with respect to FIG. 2) electrical schematic shows the temperature compensation circuit 16 and only one of the two amplifier transistors 18*a*, along with some of the circuitry associated with that amplifier transistor.

Referring now to FIG. 7, a chart shows results of the use of the temperature compensation circuit 16 in the amplifier circuit of FIG. 4. These results are for a 100 mm die using a VGG of +5 VDC. As can be seen from the chart, for a temperature range of −25° C. to 85° C., the drain current of the amplifier transistor 18*a* varies only approximately 6.5 milliamps. With an average current of approximately 401.9 milliamps, this is only a variation in the drain current of 1.6%.

The physical symmetry of the layout of the radio frequency power amplifier of the present invention and the consequent electrical balance provided thereby substantially mitigate undesirable phase shifts associated with unbalanced phase and amplitude of the outputs of the power amplifier.

Bifurcation of the input and output conductors facilitates construction thereof with widths, such as dimensions B and C of the output conductor (the dimensions of the input conduct are generally similar) which are not substantially greater than and preferably which are less than the corresponding width, dimension A, of each amplifier transistor. As those skilled in the art will appreciate, such dimensions substantially mitigate the formation of multimode oscillations, which undesirably interfere with the proper operation of the radio frequency power amplifier.

Undesirable loss due to the need for matching elements is substantially mitigated because the need for matching elements is substantially mitigated by the physical symmetry of the layout, as described above.

Undesirable thermal and electrical memory effects due to improper matching are substantially mitigated by the physical symmetry of the layout, as described above.

Undesirable variations in the gain of the radio frequency power amplifier are mitigated by the use of the temperature compensation circuit, as described above.

Thus, according to the present invention, the problems of undesirable phase shifts associated with unbalanced phase and amplitude of the outputs of the power amplifier, multimode oscillations in the input and output traces of the amplifier transistors, undesirable loss due to the need for matching elements, undesirable thermal and electrical memory effects due to improper matching, and undesirable variations in gain due to temperature changes are substantially mitigated.

It is understood that the exemplary radio frequency power amplifier with temperature compensation described herein and shown in the drawings represents only a presently preferred embodiment of the invention. Indeed, various modifications and additions may be made to such embodiment without departing from the spirit and scope of the invention. For example, rather than having two amplifier transistors, the radio frequency power amplifier may alternatively have three, four, or more amplifier transistors. Thus, according to the present invention, the radio frequency power amplifier may have any desired plural number of amplifier transistor. Further, any desired type of transistor, including both bipolar and field effect transistor, may be utilized to effect power amplification of the radio frequency signal. Further, various physical configurations of the layout are contemplated. Those skilled in the art will appreciate that various generally symmetric layouts of the conductive traces and the components are likewise suitable.

Further, a plurality of balanced radio frequency amplifiers of the present invention may be formed upon a common substrate so as to provide additional channels and/or more power output.

Thus, these and other modifications and additions may be obvious to those skilled in the art and may be implemented to adapt the present invention for use in a variety of different applications.

The invention claimed is:

1. A radio frequency power amplifier comprising:
first and second power transistors, the first and second transistors having a common element thereof electrically interconnected with a common bus; and
a forked conductor having two legs thereof electrically connected to the common bus, each leg having a distal end proximate one of the first and second amplifier translators, wherein the common bus and the forked conductor are generally symmetric about an axis about which the first and second amplifier transistors are symmetrically disposed.

2. The radio frequency power amplifier as recited in claim 1, wherein the forked conductor comprises a trace conductor.

3. The radio frequency power amplifier as recited in claim 1, wherein the two legs of the forked conductor each have a width which is less than a width of the amplifier transistors.

4. The radio frequency power amplifier as recited in claim 1, wherein a leg of the trace conductor has a width which is approximately equal to or less than a width of a proximate amplifier transistor.

5. A radio frequency power amplifier comprising:
a first amplifier transistor having an input and an output;
a second amplifier transistor having an input and an output;
an input conductor in electrical communication with the inputs of the first and second transistors, the input conductor comprising:
   a common bus formed proximate the first and second amplifier transistors and in electrical communication with an input of the first and second amplifier transistors;
   a bifurcated conductor formed to the common bus and in electrical communication therewith; and
   wherein the input conductor is generally symmetric about an axis about which the first and second amplifier transistors are symmetrically disposed.

6. The radio frequency amplifier as recited in claim 5, wherein the bifurcated conductor comprises a trunk and two branches extending from the trunk, the branches being formed at distal ends thereof to the common bus.

7. The radio frequency amplifier as recited in claim 5, wherein the bifurcated conductor comprises a trunk and two branches extending from the trunk, the branches being formed to the common bus and the branches each having a width which is approximately equal to or less than a width of one of the amplifier transistors.

8. The radio frequency amplifier as recited in claim 5, further comprising an island defined by the bus and the bifurcated conductor, the island comprising a conductive region coupled to a ground plane.

9. The radio frequency amplifier as recited in claim 5, further comprising an island defined by the bus and the bifurcated conductor, the island comprising a conductive region coupled to a ground plane and including a conductive trace.

10. The radio frequency amplifier as recited in claim 5, further comprising:
   an island defined by the bus and the bifurcated conductor, the island comprising a conductive region coupled to a ground plane including a conductive island trace;
   at least one video capacitor in electrical communication with the bus and the island electrically coupled between the bus and the conductive island trace, the video capacitor being configured to substantially short video frequency signals to ground;
   at least two second harmonic capacitors, one second harmonic capacitor on each side of the video capacitor, each second harmonic capacitor in electrical communication with the bus and the island electrically coupled between the bus and the conductive island trace and configured to substantially short second harmonics to ground; and
   wherein the island, the video capacitor(s), and the second harmonic capacitors are generally symmetrically disposed about an axis about which the first and second amplifier transistors are symmetrically disposed.

11. The radio frequency amplifier as recited in claim 10, wherein the island, the video capacitor, and the second harmonic capacitors are generally symmetrically disposed about an axis about which the first and second amplifier transistors are symmetrically disposed.

12. The radio frequency amplifier as recited in ciaim 5, further comprising:
   an island defined by the bus and the bifurcated conductor, the island comprising a conductive region coupled to a ground plane including a conductive island trace; at least one video capacitor in electrical communication with the bus and the island, the video capacitor being configured to substantially short video frequency signals to ground;
   at least two second harmonic capacitors, one second harmonic capacitor on each side of the video capacitor, each second harmonic capacitor in electrical communication with the bus and the island and configured to substantially short second harmonics to ground;
   at least two third harmonic capacitors in electrical communication with the bifurcated conductor and the ground plane and configured to substantially short third harmonics to ground; and
   wherein the island, the video capacitor(s), the second harmonic capacitors and the third harmonic capacitors are generally symmetrically disposed about an axis about which the first and second amplifier transistors are symmetrically disposed.

13. The radio frequency amplifier as recited in claim 5 further comprising:
   at least two third harmonic capacitors in electrical communication with the bifurcated conductor and the ground plane and configured to substantially short third harmonics to ground.

14. The radio frequency amplifier as recited in claim 12, wherein the island, the video capacitor, the second harmonic capacitors and the third harmonic capacitors are generally symmetrically disposed about an axis about which the first and second amplifier transistors are symmetrically disposed.

15. The radio frequency power amplifier as recited in claim 5, further comprising at least one variable capacitor in electrical communication with the input conductor and in electrical communication with the ground plane, the variable capacitor being configured so as to facilitate electrical balancing of two generally symmetric portions of the input conductor.

16. The radio frequency power amplifier as recited in claim 5, wherein the first and second amplifier transistors comprises lateral diffusion metal oxide semiconductor field effect transistors.

17. The radio frequency power amplifier as recited in claim 5, wherein the outputs of the first and second amplifier transistors comprise drains thereof.

18. The radio frequency power amplifier as recited in claim 5, wherein the common bus and the bifurcated conductor are defined by common layer of conductor formed upon a substrate.

19. The radio frequency power amplifier as recited in claim 5, further comprising first and second DC bias voltage feeds symmetrically disposed about an axis about which the first and second amplifier transistors are symmetrically disposed.

20. The radio frequency power amplifier as recited in claim 5, further comprising:
   a ground plane;
   two DC bias voltage feeds symmetrically disposed about an axis about which the first and second amplifier transistors are symmetrically disposed;
   at least one second harmonic capacitor in electrical communication with each DC bias voltage feed and in electrical communication with the ground plane;
   at least one third harmonic capacitor in electrical communication with each DC bias voltage feed and in electrical communication with the ground plane; and
   wherein the second harmonic and the third harmonic capacitors are symmetrically disposed about the axis about which the first and second amplifier transistors are symmetrically disposed.

21. The radio frequency power amplifier as recited in claim 5, further comprising:
- a ground plane;
- two DC bias voltage feeds symmetrically disposed about an axis about which the first and second amplifier transistors are symmetrically disposed;
- at least one second harmonic capacitor in electrical communication with each DC bias voltage feed and in electrical communication with the ground plane;
- at least one third harmonic capacitor in electrical communication with each DC bias voltage feed and in electrical communication with the ground plane;
- at least one video capacitor in electrical communication with each DC bias voltage feed and in electrical communication with the ground plane; and
- wherein the second harmonic capacitors, the third harmonic capacitors, and the video capacitors are symmetrically disposed about the axis about which the first and second amplifier transistors are symmetrically disposed.

22. The radio frequency power amplifier as recited in claim 5, wherein the first amplifier transistor, the second amplifier transistor and the input conductor at least partially define a radio frequency power amplifier module.

23. The radio frequency power amplifier as recited in claim 5, wherein the first amplifier transistor, the second amplifier transistor and the input conductor are contained within a common package.

24. The radio frequency power amplifier as recited in claim 5, further comprising a ground plane formed of at least one of CuW and Cu.

25. The radio frequency power amplifier as recited in claim 5, wherein the first amplifier transistor and the second amplifier transistor comprise discrete die.

26. The radio frequency power amplifier as recited in claim 5, wherein the first amplifier transistor, the second amplifier transistor and the input conductor are formed upon a common printed circuit board.

27. The radio frequency power amplifier as recited in claim 5, wherein the first amplifier transistor, the second amplifier transistor, the input conductor, a gate bias feed and a drain bias feed are formed upon a first side of a single layer printed circuit board and a ground plane is formed upon a second side of the printed circuit board.

28. A method for forming an input/output conductor for a radio frequency amplifier, the method comprising:
- forming a conductive conduit configured generally in the fashion of a Y, the Y having two branches;
- forming a bus interconnecting two distal ends of the branches; and
- wherein the conductive conduit and the bus are configured to be generally symmetric about a line which separates the two branches.

29. The method as recited in claim 28, wherein forming the conductive conduit and forming the bus comprise electroplating.

30. The method as recited in claim 28, wherein the conductive conduit and the bus are formed integrally during a common electroplating process.

31. A method for amplifying radio frequency signals, the method comprising:
- applying a radio frequency signal to a trunk of a conductive conduit;
- splitting the radio frequency signal into two components, one component being communicated through each of two branches of the conductive conduit;
- communicating the signal from each branch through a bus, the bus interconnecting distal ends of the branches;
- communicating the signal from the bus to inputs of two amplifier transistors; and
- wherein the conductive conduit and the bus are configured to be generally symmetric about a line separates the two branches.

32. A method for amplifying radio frequency signals, the method comprising:
- communicating an amplified radio frequency signal from an output of two amplifier transistors to a bus;
- communicating the amplified radio frequency signal from the bus to two branches of a conductive conduit, the bus interconnecting distal ends of the branches;
- combining the amplified radio frequency signal from each branch into a common trunk of the two branches;
- providing the combined amplified radio frequency signal as an output of a radio frequency amplifier; and
- wherein the conductive conduit and the bus are configured to be generally symmetric about a line separates the two branches.

33. A method for amplifying radio frequency signals, the method comprising:
- applying a radio frequency signal to a trunk of an input conductive conduit;
- splitting the radio frequency signal into two components, one component being communicated through each of two branches of the input conductive conduit;
- communicating the signal from each branch of the input conductive conduit to an input bus, the input bus interconnecting distal ends of the branches of the input conductive conduit;
- communicating the signal from the input bus to inputs of two amplifier transistors;
- communicating an amplified radio frequency signal from outputs of the two amplifier transistors to an output bus;
- communicating the amplified radio frequency signal from the output bus to two branches of an output conductive conduit, the output bus interconnecting distal ends of the branches of the output conductive conduit;
- combining the amplified radio frequency signal from each branch of the output conductive conduit into a common trunk of the output conductive conduit;
- providing the combined amplified radio frequency signal as an output of a radio frequency amplifier; and
- wherein the input conductive conduit and the input bus are configured to be generally symmetric about a line that separates the two branches of the input conduit and wherein the output conductive conduit and the output bus are configured to be generally symmetric about a line separates the two branches of the output conduit.

34. A radio frequency power amplifier comprising:
- a first amplifier transistor having an input and an output;
- a second amplifier transistor having an input and an output, wherein the first and second amplifier transistors define an axis about which the first and second amplifier transistors are symmetrically disposed;
- a splitting network electrically coupled to the inputs of the first and second transistor amplifiers for distributing an input signal of the RF power amplifier between the first and second amplifier transistors;
- a combining network electrically coupled to the outputs of the first and second amplifier transistors for combining output signals from the first and second amplifier transistors into an output signal of the RF power amplifier; and an output bus bar disposed perpendicular to the axis, wherein the first and second amplifier transistor outputs are electrically coupled in common to the output bus bar and wherein the combining network is electrically coupled to the outputs of the first and second amplifier transistors via the output bus bar.

35. The radio frequency power amplifier of claim 34, wherein the combining network includes a bifurcated conductor, the bifurcated conductor having two branch portions and a trunk portion, wherein the branch portions are coupled to the trunk portion, and wherein each branch portion has a width dimension on the order of less than or equal to a width dimension of a corresponding amplifier transistor.

36. The radio frequency power amplifier of claim 34, wherein the combining network includes a bifurcated conductor, the bifurcated conductor having two branch portions and a trunk portion, wherein the branch portions are coupled to the trunk portion, and wherein each branch portion has a width dimension on the order of less than or equal to a width dimension of a corresponding amplifier transistor; the radio frequency power amplifier further comprising:
  first and second transmission lines, the first and second transmission lines being substantially symmetrically disposed at opposite ends of the output bus bar.

37. The radio frequency power amplifier of claim 34, further comprising:
  an output bias supply; and
  means for shorting a modulation frequency component, the modulation shorting means being electrically coupled between the output bias supply and the output bus bar.

38. The radio frequency power amplifier of claim 34, further comprising:
  an output bias supply; and
  means for shorting a modulation frequency component, the modulation shorting means being electrically coupled between the output bias supply and the output bus bar, wherein the modulation shorting means includes a capacitor and is substantially symmetrically disposed about the axis.

39. The radio frequency power amplifier of claim 34, further comprising:
  an output bias supply;
  means for shorting a modulation frequency component, the modulation shorting means being electrically coupled between the output bias supply and the output bus bar; and
  means for shorting a third harmonic frequency component, the third harmonic shorting means being electrically coupled between the output bias supply and the output bus bar, and wherein the third harmonic shorting means is substantially symmetrically disposed about the axis.

40. The radio frequency power amplifier of claim 34, further comprising:
  an output bias supply;
  means for shorting a modulation frequency component, the modulation shorting means being electrically coupled between the output bias supply and the output bus bar; and
  means for shorting a third harmonic frequency component, the third harmonic shorting means being electrically coupled between the output bias supply and the output bus bar, and wherein the third harmonic shorting means is substantially symmetrically disposed about the axis, wherein the third harmonic shorting means includes third harmonic impedance shorts that are substantially symmetrically (i) balanced and (ii) disposed about the axis.

41. The radio frequency power amplifier of claim 34, further comprising:
  an output bias supply;
  means for shorting a modulation frequency component, the modulation shorting means being electrically coupled between the output bias supply and the output bus bar;
  means for shorting a third harmonic frequency component, the third harmonic shorting means being electrically coupled between the output bias supply and the output bus bar, and wherein the third harmonic shorting means is substantially symmetrically disposed about the axis, wherein the third harmonic shorting means includes third harmonic impedance shorts that are substantially symmetrically (i) balanced and (ii) disposed about the axis; and
  means for shorting a second harmonic frequency component, the second harmonic shorting means being electrically coupled between the output bias supply and the output bus bar, and wherein the second harmonic shorting means is substantially symmetrically disposed about the axis.

42. The radio frequency power amplifier of claim 34, further comprising:
  an output bias supply;
  means for shorting a modulation frequency component, the modulation shorting means being electrically coupled between the output bias supply and the output bus bar;
  means for shorting a third harmonic frequency component, the third harmonic shorting means being electrically coupled between the output bias supply and the output bus bar, and wherein the third harmonic shorting means is substantially symmetrically disposed about the axis, wherein the third harmonic shorting means includes third harmonic impedance shorts that are substantially symmetrically (i) balanced and (ii) disposed about the axis; and
  means for shorting a second harmonic frequency component, the second harmonic shorting means being electrically coupled between the output bias supply and the output bus bar, and wherein the second harmonic shorting means is substantially symmetrically disposed about the axis, wherein the second harmonic shorting means includes second harmonic impedance shorts that are substantially symmetrically (i) balanced and (ii) disposed about the axis.

43. The radio frequency power amplifier of claim 34, further comprising:
  means for absorbing an undesired wave on an output side of the first and second amplifier transistors, the undesired wave absorption means being proximate the output bus bar and further being substantially symmetrically disposed about the axis.

44. The radio frequency power amplifier of claim 34, further comprising:
  means for absorbing an undesired wave on an output side of the first and second amplifier transistors, the undesired wave absorption means being proximate the output bus bar and further being substantially symmetrically disposed about the axis, wherein the undesired wave absorption means includes a ground plane structure proximate the output bus bar.

45. The radio frequency power amplifier of claim 34, further comprising:
    means for absorbing an undesired wave on an output side of the first and second amplifier transistors, the undesired wave absorption means being proximate the output bus bar and further being substantially symmetrically disposed about the axis, wherein the undesired wave absorption means includes a ground plane structure proximate the output bus bar, further wherein the ground plane comprises a conductive island disposed about the axis and within a region surrounded by a combination of the output bus bar and the combining network.

46. The radio frequency power amplifier of claim 34, further comprising:
    first and second transmission lines, the first and second transmission lines being substantially symmetrically disposed at opposite ends of the output bus bar.

47. The radio frequency power amplifier of claim 34, further comprising:
    first and second transmission lines, the first and second transmission lines being substantially symmetrically disposed at opposite ends of the output bus bar, wherein each of the first and second transmission lines is configured to have a length on the order of one-half wavelength at a third harmonic frequency component short at the output bus bar.

48. A radio frequency power amplifier comprising:
    a first amplifier transistor having an input and an output;
    a second amplifier transistor having an input and an output, wherein the first and second amplifier transistors define an axis about which the first and second amplifier transistors are symmetrically disposed;
    a splitting network electrically coupled to the inputs of the first and second transistor amplifiers for distributing an input signal of the RF power amplifier between the first and second amplifier transistors;
    an input bus bar disposed perpendicular to the axis, wherein the first and second amplifier transistor inputs are electrically coupled in common to the input bus bar, and wherein the splitting network is electrically coupled to the inputs of the first and second amplifier transistors via the input bus bar;
    a combining network electrically coupled to the outputs of the first and second amplifier transistors for combining output signals from the first and second amplifier transistors into an output signal of the RF power amplifier; and
    an output bus bar disposed perpendicular to the axis, wherein the first and second amplifier transistor outputs are electrically coupled in common to the output bus bar and wherein the combining network is electrically coupled to the outputs of the first and second amplifier transistors via the output bus bar.

49. The radio frequency power amplifier of claim 48, wherein the splitting network includes a first bifurcated conductor, the first bifurcated conductor having a trunk portion and two branch portions, wherein the trunk portion is coupled to the two branch portions, and wherein each branch portion has a width dimension on the order of less than or equal to a width dimension of a corresponding amplifier transistor, and wherein the combining network includes a second bifurcated conductor, the second bifurcated conductor having two branch portions and a trunk portion, wherein the branch portions are coupled to the trunk portion, and wherein each branch portion has a width dimension on the order of less than or equal to a width dimension of a corresponding amplifier transistor, the radio frequency power amplifier further comprising:
    first and second transmission lines, the first and second transmission lines being substantially symmetrically disposed at opposite ends of the input bus bar; and
    third and fourth transmission lines, the third and fourth transmission lines being substantially symmetrically disposed at opposite ends of the output bus bar.

50. A system incorporating a radio frequency amplifier, wherein the amplifier comprising:
    a first amplifier transistor having an input and an output;
    a second amplifier transistor having an input and an output, wherein the first and second amplifier transistors define an axis about which the first and second amplifier transistors are symmetrically disposed;
    a splitting network electrically coupled to the inputs of the first and second transistor amplifiers for distributing an input signal of the RF power amplifier between the first and second amplifier transistors;
    an input bus bar disposed perpendicular to the axis, wherein the first and second amplifier transistor inputs are electrically coupled in common to the input bus bar, and wherein the splitting network is electrically coupled to the inputs of the first and second amplifier transistors via the input bus bar;
    a combining network electrically coupled to the outputs of the first and second amplifier transistors for combining output signals from the first and second amplifier transistors into an output signal of the RF power amplifier; and
    an output bus bar disposed perpendicular to the axis, wherein the first and second amplifier transistor outputs are electrically coupled in common to the output bus bar and wherein the combining network is electrically coupled to the outputs of the first and second amplifier transistors via the output bus bar.

* * * * *